United States Patent
Mohandas et al.

(10) Patent No.: US 6,933,786 B1
(45) Date of Patent: Aug. 23, 2005

(54) AMPLIFIER CIRCUIT AND METHOD

(75) Inventors: Palathol mana Sivadasan Mohandas, Bangalor (IN); Gajender Rohilla, RT-Nagar (IN); Pulkit Shah, Bangalor (IN)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/146,524

(22) Filed: May 15, 2002

(51) Int. Cl.[7] .............................. H03F 3/08
(52) U.S. Cl. .................. 330/308; 330/86; 250/214 A
(58) Field of Search .................. 330/86, 110, 282, 330/308; 250/214 A, 214 AG

(56) References Cited

U.S. PATENT DOCUMENTS

| | | | |
|---|---|---|---|
| 4,563,656 A * | 1/1986 | Baum .......................... 330/308 |
| 5,532,471 A * | 7/1996 | Khorramabadi et al. 250/214 A |
| 5,734,300 A | 3/1998 | Yoder .......................... 330/308 |
| 5,812,030 A * | 9/1998 | Inami et al. ................. 330/308 |
| 6,229,395 B1 * | 5/2001 | Kay ............................. 330/252 |
| 6,246,282 B1 * | 6/2001 | Oono et al. ................... 330/86 |
| 6,303,922 B1 | 10/2001 | Kasper ........................ 250/214 |

* cited by examiner

Primary Examiner—Henry Choe
(74) Attorney, Agent, or Firm—Law Office of Dale B. Halling LLC

(57) ABSTRACT

An amplifier system has a control circuit. An amplifier is coupled to the control circuit and has a controllable gain. A controllable input impedance circuit is coupled to the control circuit. When the gain of the amplifier is changed the controllable input impedance circuit's impedance is adjusted, so that the input impedance to the system remains essentially constant.

20 Claims, 2 Drawing Sheets

AMPLIFIER CIRCUIT AND METHOD

FIELD OF THE INVENTION

The present invention relates generally to the field of electronics and more particularly to an amplifier circuit and method.

BACKGROUND OF THE INVENTION

Amplifiers are used in numerous electronic circuits. One challenging environment is the amplification of the output of a photodiode or optical detector. The amplifier circuit is used to convert the current signal from the photodiode into a voltage signal. The current may have a wide dynamic range due to the variations in the input optical power. As a result, the amplifier circuit must accommodate a wide dynamic range. The prior art solutions generally use a trans-impedance amplifier and associated circuitry that changes the input impedance and the gain of the overall circuit. These solutions have the beneficial effect of being able to deal with the wide dynamic range. However, the variation in the input impedance result in different frequency responses for different gain settings. This results in inaccuracies in the amplified waveform.

Thus there exists a need for an amplifier circuit and method that has a variable gain and a constant input impedance.

SUMMARY OF INVENTION

An amplifier system that overcomes these problems has a control circuit. An amplifier is coupled to the control circuit and has a controllable gain. A controllable input impedance circuit is coupled to the control circuit. When the gain of the amplifier is changed the controllable input impedance circuit's impedance is adjusted, so that the input impedance to the system remains essentially constant.

DETAILED DESCRIPTION OF THE DRAWINGS

Figure 1:
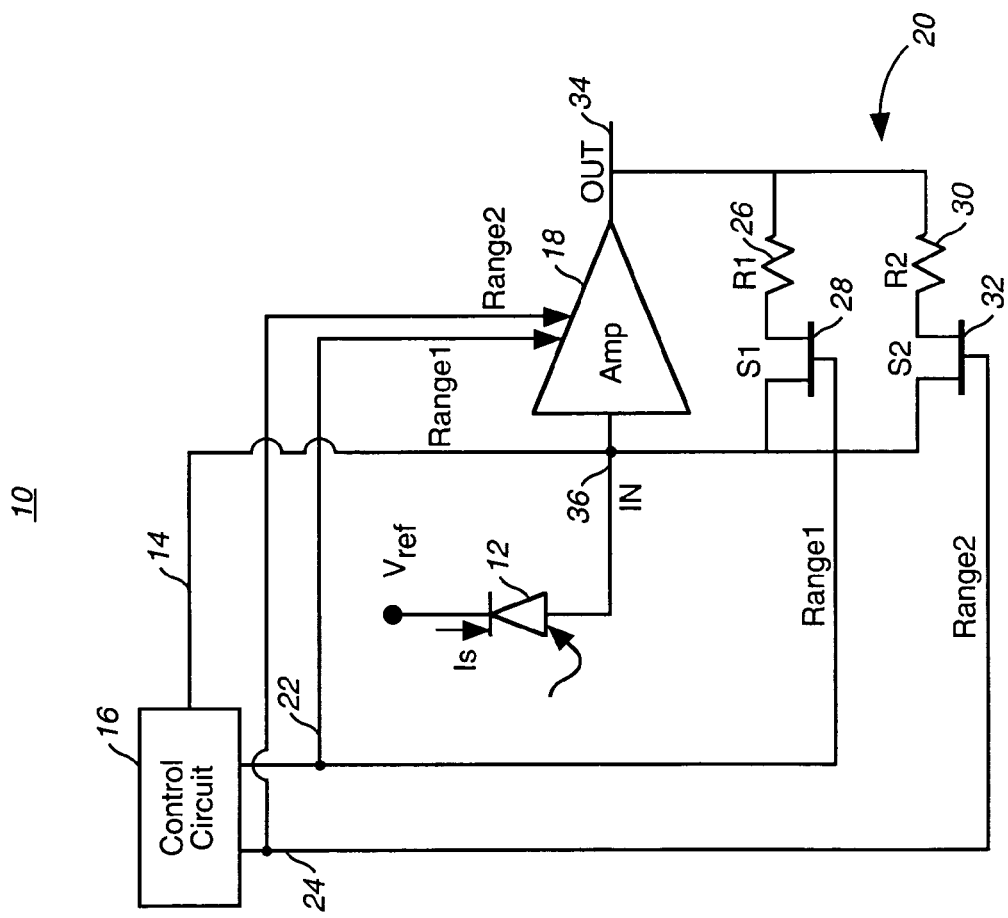
FIG. 1 is a block and schematic diagram of an amplifier system in accordance with one embodiment of the invention.

An amplifier circuit, system and method that has a variable gain and an essentially constant input impedance has a wide variety of applications in the electronics industry. The need for such an amplifier is particularly important for amplifying signals from photodiodes. FIG. 1 is a block and schematic diagram of an amplifier system 10 in accordance with one embodiment of the invention. In this figure a photodiode 12 is shown coupled to the amplifier system 10. The amplifier system 10 detects a voltage range of the output 14 of the photodiode 12 at a control circuit 16. The control circuit 16 controls a gain (controllable gain) of an amplifier (trans-impedance amplifier, open loop amplifier) 18 and a controllable input impedance circuit 20. In the embodiment shown, the control circuit 16 can select between a first range 22 and a second range 24. The controllable input impedance circuit 20 is formed by a variable feedback resistance. The variable feedback resistance in the embodiment shown, has a first resistor 26 in series with a first switch 28. The first switch 28 is controlled by the control circuit 16. The variable feedback resistance also has a second resistor 30 in series with a second switch 32. The first resistor 26 is electrically in parallel with the second resistor 30 and both resistors 26, 30 are connected between the output 34 and the input 36 of the amplifier 18. While the controllable input impedance circuit 20 is shown as having two (or three) settings it will be apparent to those skilled in the art how the circuit can be made to have numerous setting or perhaps a variable setting.

The control circuit 16 adjusts the open loop gain of the amplifier 18 based on the output voltage. The output voltage is directly related to the input current. In one embodiment, when the output voltage is in a standard range and the first range line 22 is on the amplifier gain is A. In addition the first switch 28 is on (closed) and the second switch 32 is off (open). As a result the input impedance is R1/A. When a large output voltage is detected, the range two line 24 is turned on by the control circuit 16. The gain of the amplifier is reduced to A*R2/R1. The second switch 32 is on and the first switch 28 is off in the second range. Thus the input impedance remains R1/A (fixed input impedance).

Figure 2:
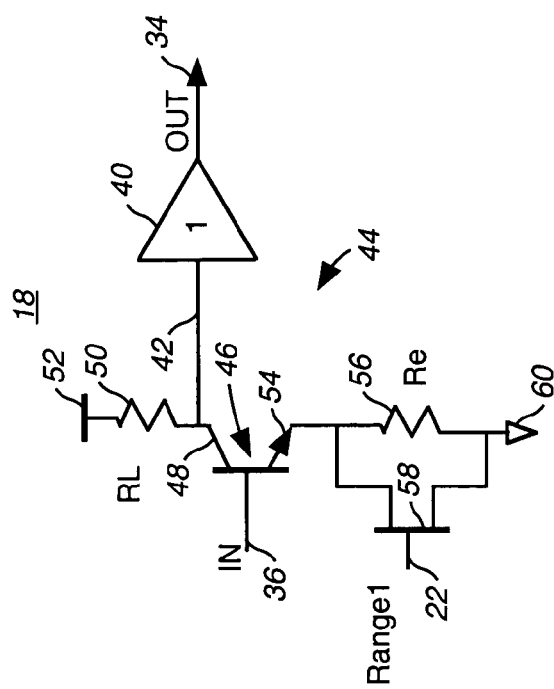
FIG. 2 is a schematic diagram of the amplifier of FIG. 1 in accordance with one embodiment of the invention.

FIG. 2 is a schematic diagram of the amplifier 18 of FIG. 1 in accordance with one embodiment of the invention. The amplifier 18 has an amplifier 40 with an input 42 connected to a gain adjustment element (gain control circuit) 44. The input 36 to the amplifier 18 is connected to the base of a transistor 46. The collector 48 of the transistor 46 is connected to the input 42 of amplifier 40 and to a load resistor 50. The other end of the load resistor 50 is connected to a source voltage 52. The emitter 54 is connected to a current (gain) limiting resistor 56. The gain adjustment resistor 56 is in parallel with a switch 58. The other end of the gain adjustment resistor 56 is connected to ground 60. The switch 58 is connected to the first range control line 22. When the first range line is on (high) the switch (transistor) 58 is closed and the gain adjustment resistor 56 is bypassed. When the second range line is on (high) and the first range line is off (low) the switch 58 is open and the current flows through the gain adjustment resistor 56. The value of the gain adjustment resistor is selecting using the equation below:

$$Re = (1/gm)((R1/R2)-1)$$

Where gm is the transconductance of transistor 46. By selecting the resistor Re to have this value the gain of the amplifier 18 in range two will be the same as discussed above.

Figure 3:
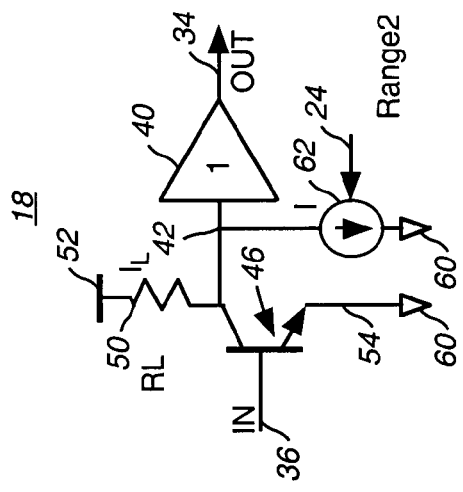
FIG. 3 is a schematic diagram of the amplifier of FIG. 1 in accordance with one embodiment of the invention.

FIG. 3 is a schematic diagram of the amplifier 18 of FIG. 1 in accordance with one embodiment of the invention. The embodiment shown in FIG. 3 is similar to FIG. 2 except the gain adjustment resistor 56 and associated switch 58 have been replaced with a controllable current source 62. The emitter 54 of the transistor 46 is connected directly to ground 60. The controllable current source 62 is connected to the input 42 of the amplifier 40 and has a control input connected to the second range control line 24. When the second range line is on (high) the controllable current source 62 is on and as a result reduces the input current to the transistor 46. The amount of current the controllable current source is designed to draw is given by the equation below:

$$I = I_L(1 - R2/R1)$$

By selecting the current source to have this value, the relationship between the gain of the amplifier 18 in range one and range two will be the same as discussed above.

Figure 4:
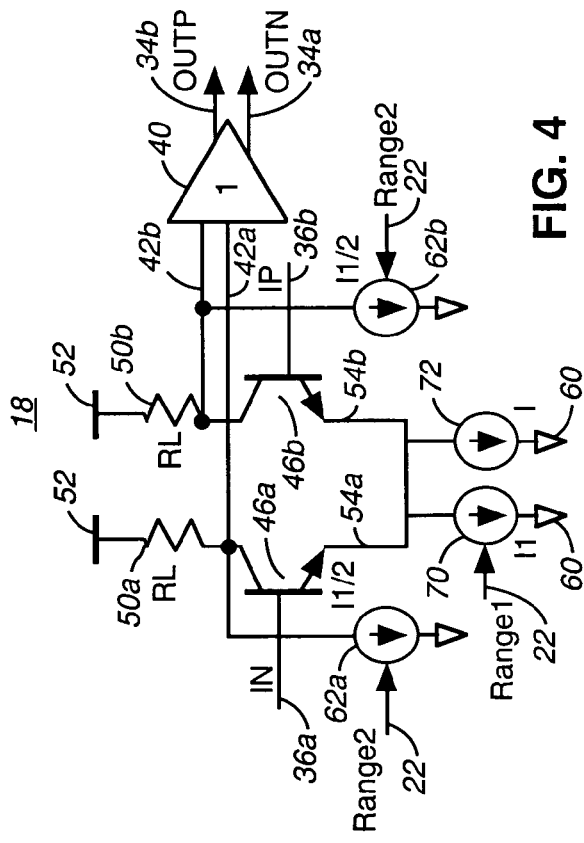
FIG. 4 is a schematic diagram of the amplifier of FIG. 1 in accordance with one embodiment of the invention.

FIG. 4 is a schematic diagram of the amplifier 18 of FIG. 1 in accordance with one embodiment of the invention. FIG. 4 is similar to FIG. 3 except that it is designed to have a differential inputs 36a, 36b. All the differential sections of the circuit shown in FIG. 3 are labeled "a" & "b" and have essentially the same function. One difference is that the current sources 62a, 62b supply a current of ½*I. In addition, two new current sources have been added. A first controllable current source 70 coupled to control line 22 and a second constant current source 72. The amount of current supplied by the first controllable current source 70 is defined by the equation given below:

$$I1=I*(R1/R2-1)$$

Where I is the current supplied by the second constant current source 72. This arrangement results in the gains defined above for the amplifier in range one and range two.

Thus there has been described an amplifier circuit and method that has a variable gain and a constant input impedance. Many variations will be apparent to those skilled in the art. For instance, the number gain values may be increased. In addition, The gain values may be made continuously variable. Other input impedance circuits may be used to obtain a constant input impedance. Other current (or gain) limiting circuits may also be used.

The process embodied in the circuits and systems may be generalized. The process involves determining an output voltage. In the embodiments shown, this is determined by the control circuit 16. The feedback resistance is determined based on the output voltage. An internal gain of the amplifier 18 is determined based on the feedback resistance. This step may be performed by the control circuit 16. In one embodiment, the feedback resistance is determined to produce a constant input impedance.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An amplifier circuit comprising:
    a trans-impedance amplifier having a discrete controllable gain settings; and
    a controllable input impedance circuit coupled to the trans-impedance amplifier, set to have a constant input impedance.

2. The amplifier circuit of claim 1, further including a control circuit coupled to the trans-impedance amplifier and the controllable input impedance.

3. The amplifier circuit of claim 2, wherein the control circuit adjusts the controllable input impedance circuit to maintain a fixed input impedance when the controllable gain is adjusted.

4. The amplifier circuit of claim 1, wherein the trans-impedance amplifier includes a gain control circuit coupled to an open loop amplifier.

5. The amplifier circuit of claim 4, wherein the gain control circuit has a gain adjustment element.

6. The amplifier circuit of claim 5, wherein the gain adjustment element includes a switch in parallel with a resistor.

7. The amplifier circuit of claim 5, wherein the gain adjustment element is a controllable current source.

8. The amplifier circuit of claim 7, wherein the open loop amplifier includes a differential amplifier.

9. A method of operating an amplifier circuit, comprising the steps of:
    a) determining an output voltage;
    b) determining a discrete feedback resistance setting based on the output voltage; and
    c) determining an internal gain of the amplifier circuit based on the feedback resistance.

10. The method of claim 9, wherein step (c) further includes the step of:
    (c1) determining the feedback resistance to produce a constant input impedance.

11. The method of claim 9, wherein step (b) further includes the step of:
    (b1) altering an internal gain of the amplifier circuit.

12. An amplifier system comprising:
    a control circuit;
    an amplifier having a controllable gain coupled to the control circuit; and
    a controllable input impedance circuit with discrete settings coupled to the control circuits set by the control circuit to have a constant input impedance.

13. The system of claim 12, wherein the controllable input impedance circuit includes a variable feedback resistance.

14. The system of claim 13, wherein the variable feedback resistance includes a first resistor in series with a first switch and a second resistor in series with a second switch.

15. The system of claim 14 wherein the first resistor is electrically in parallel with the second resistor.

16. The system of claim 12, wherein the amplifier includes an open loop amplifier coupled to a gain adjustment element.

17. The system of claim 16, wherein the gain adjustment element includes a switch in parallel with a resistor.

18. The system of claim 16, wherein the gain adjustment element includes a controllable current source.

19. The system of claim 16, wherein the open loop amplifier includes a differential amplifier.

20. The system of claim 19, wherein the gain adjustment element has a pair of controllable current sources.

* * * * *